(12) United States Patent
De

(10) Patent No.: US 9,879,357 B2
(45) Date of Patent: Jan. 30, 2018

(54) METHODS AND SYSTEMS FOR THIN FILM DEPOSITION PROCESSES

(71) Applicant: TIVRA CORPORATION, Oakland, CA (US)

(72) Inventor: Indranil De, Mountain View, CA (US)

(73) Assignee: TIVRA CORPORATION, Pleasant Hill, CA (US)

(*) Notice: Subject to any disclaimer, the term of this patent is extended or adjusted under 35 U.S.C. 154(b) by 681 days.

(21) Appl. No.: 13/794,372

(22) Filed: Mar. 11, 2013

(65) Prior Publication Data
US 2014/0251205 A1 Sep. 11, 2014

(51) Int. Cl.
| | | |
|---|---|---|
| *C30B 23/04* | (2006.01) | |
| *C30B 23/06* | (2006.01) | |
| *C30B 25/10* | (2006.01) | |
| *C30B 23/02* | (2006.01) | |
| *C30B 13/24* | (2006.01) | |

(52) U.S. Cl.
CPC ............ *C30B 23/066* (2013.01); *C30B 13/24* (2013.01); *C30B 23/02* (2013.01); *C30B 23/04* (2013.01); *C30B 25/105* (2013.01)

(58) Field of Classification Search
CPC ............................ C30B 323/02; C30B 323/04
USPC ...................... 117/84, 88, 98, 107
See application file for complete search history.

(56) References Cited

U.S. PATENT DOCUMENTS

| | | |
|---|---|---|
| 4,222,345 A | 9/1980 | Bergfelt et al. |
| 4,999,314 A | 3/1991 | Pribat et al. |
| 5,372,089 A * | 12/1994 | Yoshida .................. C30B 23/02 117/98 |
| 5,821,562 A | 10/1998 | Makita et al. |
| 5,906,857 A | 5/1999 | McKee et al. |
| 6,645,833 B2 | 11/2003 | Brendel |
| 7,247,889 B2 | 7/2007 | Hanson et al. |
| 7,972,440 B2 | 7/2011 | Houge et al. |
| 8,956,952 B2 | 2/2015 | Machuca et al. |
| 9,487,885 B2 | 11/2016 | Machuca et al. |

(Continued)

FOREIGN PATENT DOCUMENTS

| | | |
|---|---|---|
| EP | 0544399 A2 | 6/1993 |
| GB | 1113211 A | 5/1968 |

(Continued)

OTHER PUBLICATIONS

Supplementary Search Report as retrieved in corresponding European Application No. 13803800.5, dated Nov. 26, 2015.
PCT International Preliminary Report on Patentability for application PCT/US2013/045482 dated Dec. 16, 2014.
PCT International Preliminary Report on Patentability for application PCT/US2014/070137 dated Jun. 14, 2016.

(Continued)

*Primary Examiner* — Matthew Song
(74) *Attorney, Agent, or Firm* — Alston & Bird LLP

(57) ABSTRACT

A system for depositing a film on a substrate comprises a lateral control shutter disposed between the substrate and a material source. The lateral control shutter is configured to block some predetermined portion of source material to prevent deposition of source material onto undesirable portion of the substrate. One of the lateral control shutter or the substrate moves with respect to the other to facilitate moving a lateral growth boundary originating from one or more seed crystals. A lateral epitaxial deposition across the substrate ensues, by having an advancing growth front that expands grain size and forms a single crystal film on the surface of the substrate.

11 Claims, 3 Drawing Sheets

(56) References Cited

U.S. PATENT DOCUMENTS

| | | | |
|---|---|---|---|
| 2003/0017622 A1 | 1/2003 | Mastroianni | |
| 2004/0177802 A1 | 9/2004 | Sprenger et al. | |
| 2008/0029773 A1 | 2/2008 | Jorgenson et al. | |
| 2008/0164570 A1 | 7/2008 | Kouvetaks | |
| 2009/0308739 A1* | 12/2009 | Riker | H01J 37/3447 204/298.11 |
| 2010/0176369 A2 | 7/2010 | Oliver et al. | |
| 2010/0295061 A1* | 11/2010 | Sachs | C30B 1/02 257/77 |
| 2011/0048320 A1* | 3/2011 | Choi | C23C 14/042 118/301 |
| 2011/0186874 A1 | 8/2011 | Shum | |
| 2011/0294281 A1 | 12/2011 | Zang et al. | |
| 2012/0019189 A1 | 1/2012 | Kim | |
| 2013/0082239 A1 | 4/2013 | Pan et al. | |
| 2013/0161637 A1 | 6/2013 | Werkhoven et al. | |
| 2013/0333611 A1 | 12/2013 | De et al. | |
| 2014/0134765 A1 | 5/2014 | Chen | |
| 2014/0191249 A1 | 7/2014 | Blanchard et al. | |
| 2014/0264396 A1 | 9/2014 | Lowenthal et al. | |
| 2014/0306320 A1 | 10/2014 | Arena | |
| 2015/0144956 A1 | 5/2015 | Watanabe et al. | |
| 2016/0380045 A1 | 12/2016 | Machuca et al. | |
| 2016/0380154 A1 | 12/2016 | Machuca et al. | |

FOREIGN PATENT DOCUMENTS

| | | |
|---|---|---|
| JP | 2003-523080 A | 7/2003 |
| JP | 2007294579 A | 7/2008 |
| JP | 2010-538949 A | 12/2010 |
| TW | 591202 | 6/2004 |
| TW | 201145447 A1 | 12/2011 |
| WO | 2007094516 A1 | 8/2007 |
| WO | WO 2010/039936 A2 | 4/2010 |
| WO | WO 13/188574 | 12/2013 |
| WO | WO 2013/188574 A2 | 12/2013 |
| WO | WO 2015/089466 A1 | 6/2015 |
| WO | WO 2016/210499 A1 | 12/2016 |

OTHER PUBLICATIONS

PCT International Search Report and Written Opinion of the International Searching Authority for application PCT/US2014/070137 dated Apr. 30, 2015.
U.S. Appl. No. 13/794,327, Notice of Allowance dated May 15, 2014.
U.S. Appl. No. 13/794,327, Notice of Allowance dated Jul. 18, 2014.
U.S. Appl. No. 13/794,327, Notice of Allowance dated Oct. 16, 2014.
U.S. Appl. No. 14/106,657, Final Office Action dated Apr. 4, 2016.
U.S. Appl. No. 14/106,657, Non-Final Office Action dated Sep. 1, 2015.
U.S. Appl. No. 14/106,657, Notice of Allowance dated Jul. 1, 2016.
U.S. Appl. No. 14/106,657, Notice of Allowance dated Jul. 20, 2016.
U.S. Appl. No. 14/106,657, Requirement for Restriction/Election dated Jun. 11, 2015.
Beresford et al., "Group IVB refractory metal crystals as lattice-matched substrates for growth of the group III nitrides by plasma-source molecular beam epitaxy," Journal of Crystal Growth, 178:189-200, (1997).
PCT International Search Report and Written Opinion of the International Search Authority for application PCT/US2016/039675 dated Sep. 15, 2016.
U.S. Appl. No. 13/794,285, Final Office Action dated Jun. 15, 2017.
U.S. Appl. No. 13/794,285, Non-Final Office Action dated Sep. 15, 2016.
U.S. Appl. No. 14/106,657, Notice of Allowance dated Sep. 29, 2016.
U.S. Appl. No. 15/161,111, Final Office Action dated Jun. 14, 2017.
U.S. Appl. No. 15/161,111, Non-Final Office Action dated Feb. 10, 2017.
U.S. Appl. No. 15/194,517, Requirement for Restriction/Election dated Jan. 27, 2017.
U.S. Appl. No. 15/194,517, Non-Final Office Action dated Jul. 10, 2017.

* cited by examiner

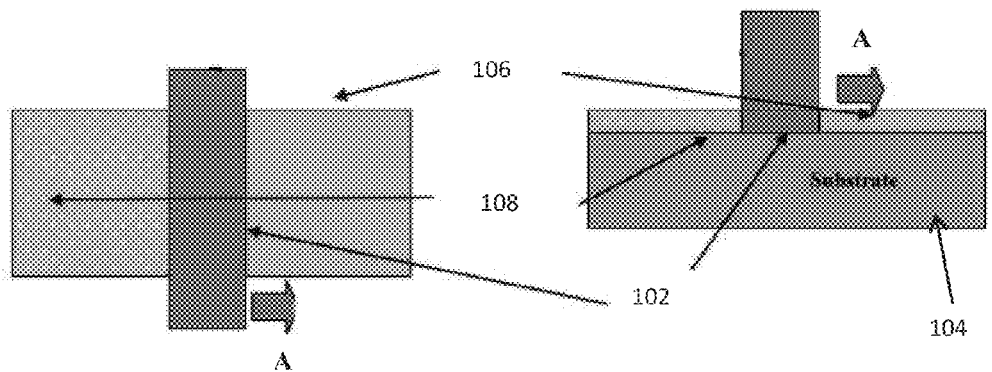
FIG. 1A
(Prior art)
FIG. 1B
(Prior art)
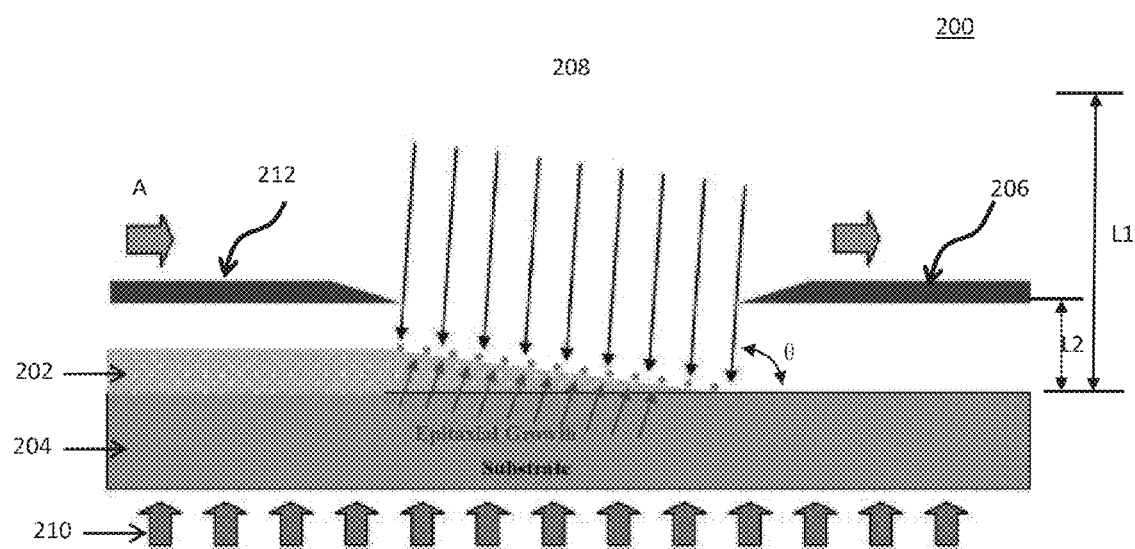
FIG. 2

METHODS AND SYSTEMS FOR THIN FILM DEPOSITION PROCESSES

TECHNICAL FIELD

The example embodiments of the present invention generally pertain to semiconductor materials, methods, and devices, and more particularly to methods and system for thin film deposition processes.

BACKGROUND

Semiconductor materials are widely used in electronic and optoelectronic applications such as semiconductor chips, solar cells, light emitting diodes (LED), high-power semiconductor devices, power RF devices, flexible electronics, etc. Many of these applications are made by depositing a thin film on a substrate including foreign material, for example, depositing a thin film of Titanium on an amorphous substrate. Amorphous substrates, however, have no long-rang structural order that typically characterizes a crystal, causing many atoms to form undesirable bonding orientations and significantly decreasing the crystalline quality along with negatively impacting electronic properties of the semiconductor materials. As such, lack of long-range order in the amorphous substrate poses challenges on deposition of the thin film in order to achieve long range order or single crystal structure.

Thin semiconducting films are usually deposited on the amorphous substrate using molecular beam epitaxy (MBE) or metal organic chemical vapor deposition (MOCVD) techniques, and in some cases using atomic layer deposition (ALD) or atomic layer epitaxy (ALE). By using these methods, however, not all atoms, ions, or molecules have an opportunity to organize themselves into regular arrangements that would lead to long range order of sufficient high crystalline quality. The latter is typically described in terms of crystal size, grain size, carrier lifetime, and diffusion lengths. To overcome this drawback, it is desired to grow large crystals on the substrate, where large refers to average crystal size that is at least ten times greater in physical extent in comparison to typical electrical diffusion lengths in the semiconductor (e.g. average crystal size is 100 microns, and diffusion lengths are 1-10 microns, 1 micron is equal $1 \times 10^{-6}$ meters). Zone melt recrystallization (ZMR) is a technique for growing large crystals on a substrate. In this method, a molten region, e.g., molten zone 102 as shown in FIGS. 1A and 1B, in the deposited film is heated by a heat source (not shown) to melt the deposited material in the molten zone 102. The molten zone 102 moves across the deposited film by moving the heat source in direction A with respect to substrate 104. Deposited material to be melted represented by region 106 continues entering the molten zone 102 and is melted in the molten zone 102 while material leaving the molten zone 102 is solidified and recrystallized to form a recrystallization zone 108. In other words, as the melt zone 102 passes over the substrate 104, a large solid and single crystal is left in the wake of the melt. This is the primary method of extending a small single crystal laterally using ZMR.

While ZMR is a very well-proven technique to create high quality crystalline material it may suffer from the drawback that the temperature generated for melting a portion of the deposited film may exceed the maximum temperature that can be handled by the underlying substrate. To prevent the underlying substrate from being heated to the melting point of the deposited film, the heating time may be shortened, such as by using high repetition rate pulsed lasers. However, shortening the heating time means that while solidifying, the crystal structure may grow in vertical direction rather than in both vertical and lateral directions simultaneously. Hence, epitaxial growth may be dominated in the vertical direction rather than the lateral direction resulting in patches of small grains along the substrate. The primary function of ZMR as described above, necessarily requires a single seed to originate from a single point or edge that can effectively be extended laterally.

BRIEF SUMMARY

According to one exemplary embodiment of the present invention, a system for depositing a film on a substrate comprises a shutter disposed between the substrate and a material source configured to block some predetermined portion of source material to prevent deposition of source material onto portions of the substrate. The lateral control shutter and the substrate moves with respect to the other. The relative motion facilitates the creation of a moving lateral growth boundary allowing lateral epitaxial deposition across the substrate.

According to another exemplary embodiment of the present invention, a method of depositing a film on a substrate comprises directing source material from a material source onto the surface of the substrate, blocking some predetermined portion of the substrate to prevent deposition of source material onto portions of the substrate. In addition, creating a moving lateral growth boundary, leads to the formation of the film laterally and epitaxially with coverage over the substrate.

BRIEF DESCRIPTION OF THE DRAWING(S)

Having thus described the example embodiments of the present invention in general terms, reference will now be made to the accompanying drawings, which are not necessarily drawn to scale, and wherein:

FIG. 1A illustrates a top view of a schematic of a known type of zone melt recrystallization;

FIG. 1B illustrates a cross-sectional view of a schematic of zone melt recrystallization;

FIG. 2 illustrates a system of depositing a film on a substrate in accordance with an exemplary embodiment;

DETAILED DESCRIPTION

Figure 3A:
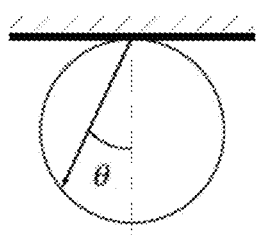
FIGS. 3A-3C illustrate exemplary angular distributions of vaporized material in a sputtering deposition process.

The various embodiments are described more fully with reference to the accompanying drawings. These example embodiments are provided so that this disclosure will be thorough and complete, and will fully convey the scope of the invention to readers of this specification having knowledge in the technical field. Vertical and lateral directions refer respectively to the direction that is normal to substrate surface on which a thin film is deposited and a direction parallel to the substrate surface. Like numbers refer to like elements throughout.

FIG. 2 illustrates a system 200 of depositing a film on a substrate in accordance with an exemplary embodiment ("example," "exemplary" and like terms as used herein refer to "serving as an example, instance or illustration"). To facilitate epitaxial deposition of a thin film 202 on a substrate 204 in lateral direction A, a lateral control shutter 206 is employed and disposed between the substrate 204 and a material source 208. The material source 208 is configured to deposit source material onto substrate surface using a suitable deposition method. Depending on the deposition method employed, the source material may be vaporized from a solid or liquid source in the form of atoms or molecules and transported as a vapor through a vacuum or low-pressure gas or plasma environment to the substrate. The vaporized material may be an element, alloy, or compound in various charged states. When vaporized material has a long mean free path greater than 1 meter and the trajectory of the vaporized material may be considered direct line-of-sight. The deposition process employed is therefore defined as light-of-sight deposition. Line-of-sight deposition methods may be physical vapor deposition or chemical vapor deposition, including vacuum evaporation, sputtering, pulsed laser deposition, molecular beam epitaxy, atomic layer deposition, atomic layer epitaxy, plasma torch deposition and/or any other suitable methods. The chemical vapor deposition may be atmospheric chemical vapor deposition and/or any other suitable chemical vapor deposition methods. Depending on the source configurations, the vacuum evaporation includes thermal evaporation, laser beam or focused lamp evaporation, arc-discharge evaporation and electron-beam evaporation. Similarly, depending on the source configurations, the sputtering method may comprise one of direct current sputtering, magnetron sputtering, radio frequency sputtering, and pulsed laser sputtering.

In any application of the above deposition methods, distance L1 between the material source 208 and the substrate 204 may be less than the mean free path of the gas molecules thus allowing most of the molecules in a gas to arrive in a collimated manner. To uniformly form the thin film 202 over the substrate 204 surface, distance L2 between the lateral control shutter 206 and the substrate surface may be less than the mean free path of the gas molecules. In this case, the mean free path is defined as the average distance a gas molecule travels before colliding with another gas molecule. The substrate 204 may comprise of silicon dioxide, silicon nitride, amorphous boronitride, amorphous tungsten nitride, glassy amorphous carbon, amorphous rare earth oxides, amorphous zinc-oxide, and silicate glass.

Figure 3B:
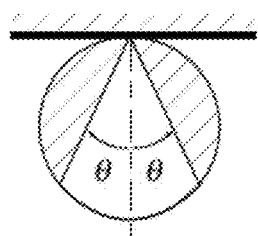
Figure 3C:
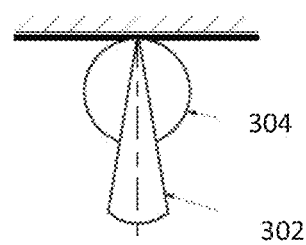

Different deposition processes may have different flux angular distributions at the substrate. There are many ways in each deposition process to aid improvement of the angular distribution at the substrate. Taking sputtering deposition process as an example, in a general sputtering deposition process, it is not unusual that a large fraction of the atoms impinging on the substrate may not impinge the substrate at a normal incidence angle because the atoms are emitted from the material source (i.e., sputtering target) in a cosine angular distribution, as shown in FIG. 3A. To produce more normal angular distribution at the substrate, a collimator may be employed and placed between the substrate and the sputtering target in a magnetron sputtering system. The employment of the collimator tends to reduce the non-normal flux from the sputtering target resulting in an increase of the directionality of the deposit. The angular distribution of collimated incidence are shown in FIG. 3B. In an ion-assisted deposition process, a fraction of the sputtered atoms are ionized. The ionized atoms may be concentrated near $\theta=0°$ to form a directional angular distribution, e.g., directional angular distribution 302, while the neutral species typically have a cosine angular distribution 304. The overall angular distribution is viewed as a superposition of a cosine and directional angular distribution as shown in FIG. 3C.

In vapor deposition processes, the angle of incidence of evaporated material onto the substrate may affect the film properties, crystal orientation and other characteristics. Depending on the angular distribution of the incident atom flux generated by the material source and the desired angular distribution of the atoms at the substrate, the vaporized material may be deposited onto the substrate surface at normal angle-of-incidence or off-normal angle-of-incidence. In the embodiment illustrated in FIG. 2, the source material may be deposited at angles of incidence of $-15°$ to $+15°$. The mean angle-of-incidence of the depositing atom flux may vary depending on deposition geometry, type of vaporization source and relative movement between the substrate and the material source.

Referring back to FIG. 2, the lateral control shutter 206 is employed to control film growth. The lateral control shutter 206 may define a lateral boundary (not numbered) of the depositing thin film 202 and cover some predetermined portion of the substrate 204 to prevent deposition of source material onto portions of the substrate surface. In operation, by moving one or the other of the lateral control shutter 206 or the substrate 204, the lateral boundary of the depositing thin film 202 is moved and controlled to advance the growing edge of the film to facilitate the lateral epitaxial deposition across the substrate. In one example illustrated in FIG. 2, the lateral control shutter 206 is moved with respect to the substrate 204 in direction A. In another example, the lateral control shutter may remain static while the substrate moves with respect to the lateral control shutter. Still in another example, both the lateral control shutter and the substrate may move at a different speed to achieve relative movement there between. The system 200 may also include a drive system (not shown) to control the relative movement between the lateral control shutter and substrate. The system 200 may include a trailing control shutter 212 which is used to help mask any unwanted deposition onto the single crystal being left behind the advancing growing edge of the thin film 202. The latter assists in maintaining uniform film thickness across the thin film 202. If a trailing control shutter is employed, the trailing control shutter 212 can be configured to avoid further epitaxial deposition onto the newly crystallized thin film 202 over the substrate 204.

Since many film properties, such as grain size of the deposited material on the substrate, are influenced by the deposition temperature, temperature control is desirable. Depending on the deposition methods employed, the system 200 may include different types of heat sources (e.g., heat source 210 in FIG. 2) to control the temperature of the substrate and/or provide elevated temperatures that may be used in the deposition process. For example, in a vacuum deposition process, heat sources are typically used to thermally evaporate source material, desorb deposited material from target source surfaces, heat substrates for cleaning and subsequent processing, melt source material, and add thermal kinetic energy or to enhance surface mobility of adatoms or molecules participating in the deposition process on the substrate surface. Heat may be generated in the vacuum chamber by a number of different techniques. In the example of a sputtering deposition process, the substrate may be heated by ion bombardment, electrons, optical radiation, inductive heating, or other heating techniques. The heat source may be embedded in or external to the system. Exemplary heat sources may include a radiant heater (infrared heating, lasers, and the like), hot wire radiative heating, focused lamp heating, inductive heating, direct metal pedestal heater, or ceramic pedestal heater.

Figure 4A:
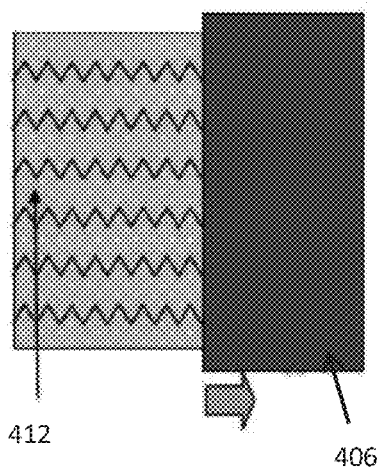
FIGS. 4A-4D illustrate methods of growing large extended crystals on the substrate in accordance with exemplary embodiments of the present invention.

When film of a single crystal material is deposited on a substrate, epitaxial growth occurs allowing the crystallographic structure of the substrate to be reproduced in the growing material when a single seed is isolated on the substrate surface or when the substrate is single crystal. As lateral growth of crystals plays an important role in determining the material properties, such as dislocation density and strain that result from a lattice mismatch between the deposited material and the substrate, a lateral control shutter can be employed to facilitate the epitaxial growth of the deposited material in a lateral direction. Due to relative movement between a lateral control shutter and the substrate, the epitaxial growth initially occurs in the direction substantially normal to the surface of the substrate, e.g., in a vertical direction, and then proceeds in a direction substantially parallel to the surface of the substrate, e.g., in a parallel direction. A lateral crystalline epitaxial growth is illustrated in FIG. 4A. In FIG. 4A, the lateral control shutter 406 moves from the left end 412 of the substrate toward the other end of the substrate (not shown), allowing the epitaxial growth to start from the left end 412. A plurality of grains at many points on the left end 412 may grow and serve as seed crystals for subsequent crystal growth. Crystals initially grow in a vertical direction. With the movement between the lateral control shutter 406 and the substrate, crystals may grow in the lateral direction and the vertical direction simultaneously.

Grain size of the deposited film plays an important role in its electrical properties. As the grain size increases, the number of grain boundaries per unit area and the number of boundary interfaces decrease. For example, a high density of grain boundaries, e.g., a small grain size, or extended defects in the crystal structure, tends to decrease the electrical and thermal conductivity of the deposited film. Hence it is desirable to increase grain size where possible. Exemplary embodiments of achieving minimum grain boundaries and minimum number of grains on the substrate are illustrated in FIGS. 4B-4D.

Figure 4B:
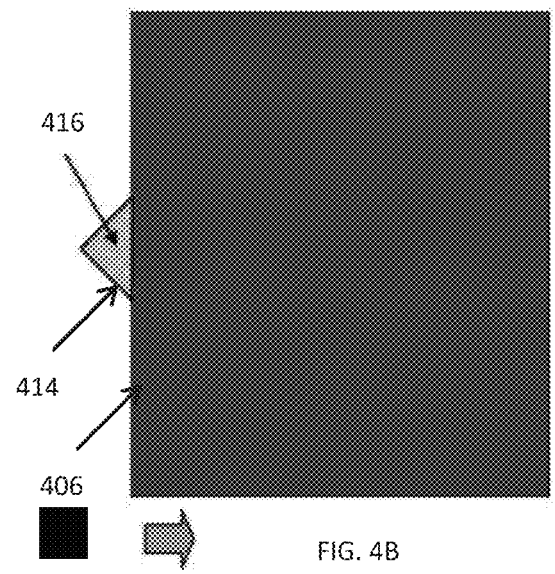

As shown in FIG. 4B, the lateral control shutter 406 is placed between the substrate (not shown) and the material source (not shown) and covers a portion of the substrate, leaving a region (e.g., region 414) exposed to the material source. The region 414 may have a sharp corner or an edge. In this embodiment, the sharp corner is a corner of the substrate made by adjusting the placement of the lateral control shutter and the substrate. By such an arrangement, a self-selected seed grain 416 may grow at the sharp corner. The seed grain serves as a seed crystal to initiate crystallization and to provide a point for the deposition to begin. With relative movement between the lateral control shutter 406 and the substrate in the lateral direction, a crystal grows simultaneously in both the vertical and lateral directions across the entire surface of the substrate. In another example, there may be more than one seed grain grown at the sharp corner and the lateral advancement aids in driving the grain boundaries in outward directions, effectively forming a minimum plurality of grains with very large lateral dimensions across the entire substrate.

Figure 4C:
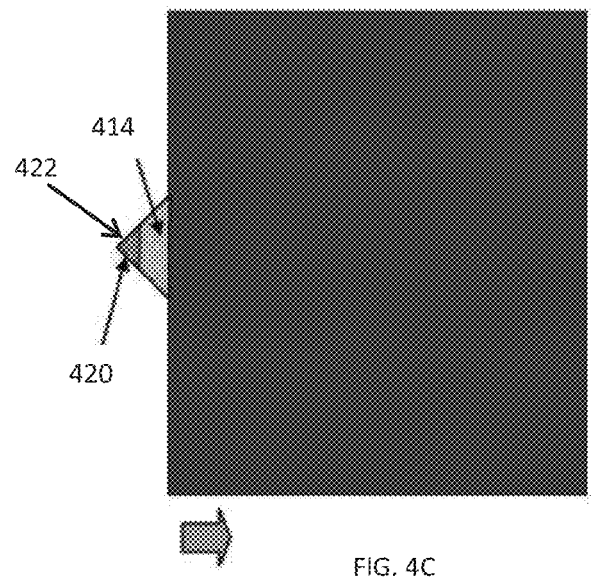
Figure 4D:
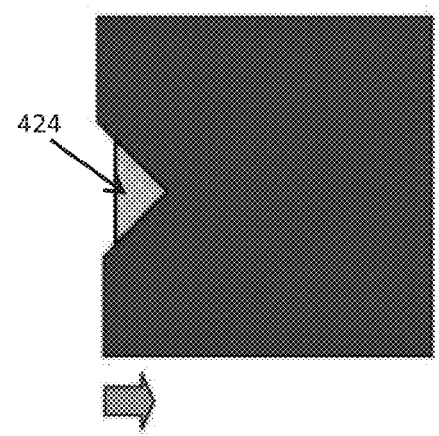

In an embodiment illustrated in FIG. 4C, graphoepitaxy may be employed for creating long-range order during thin film deposition on the substrate surface or during recrystallization of molten material on the substrate surface by patterning a portion of the substrate surface to form a surface relief structure, e.g., surface relief structure 420. The surface relief structure 420 may serve as a template for growing a seed grain on the substrate and induce a desired crystallographic orientation in the newly growing thin film. The seed grain is then employed to initiate crystallization and to provide a point of origin for the depositing film to begin. Similar to the embodiment illustrated in FIG. 4B, with relative movement between the lateral shutter 406 and the substrate in the lateral direction, the single grain simultaneously grows in both vertical and lateral directions across the entire surface of the substrate. The surface relief structure 420 may be made by a variety of lithography techniques, such as optical lithography, electron beam lithography, nanoimprint lithography, or focused-ion-beam (FIB) lithography and/or any other suitable lithography techniques. Alternatively, the surface relief structure 420 might be transferred or added to the corner or edge of the substrate by laser heating process or ablation. In this embodiment, the seed grain may extrude out on the substrate plane as the growing edge advances away from the corner.

In addition to introduction of the surface relief structure 420, a seed crystal 422 may be added to a point of the substrate, for example, a corner of the substrate. The seed crystal may be employed to initiate crystallization and to provide a point of origin for the depositing film to begin. Similarly, the added seed crystal may extrude out on the substrate plane as the growing edge advances away from the corner.

Similar to FIG. 4B, FIG. 4D illustrates a seed grain growing outward laterally beginning at a sharp corner of a region 424 of the substrate with the region exposed to the material source. In contrast to FIG. 4B, the sharp corner in this embodiment is not made by adjusting the placement of the substrate and the lateral control shutter. Instead the sharp corner is shaped by a shutter having such a shape. A seed grain may grow at the sharp corner and serve as a seed crystal to initiate crystallization and to provide a point of origin for the deposition to begin. The added advantage of utilizing a triangle as shown, or a crescent with same curvature, is that through grain competition the grain boundaries will grow perpendicular to the shape of the shutter edge. The latter will necessarily grow any grains parallel to the plane of the substrate wider as the growing edge advances away from the seed crystal.

In the embodiments described above, the shutter may have various shapes according to different applications. For example, as illustrated in FIG. 4D, the shutter may be in the shape of a polygon or an arc. A portion of the periphery of the polygon defines a shape with a sharp corner at which the seed grain grows. The shutter may be in the shape of rectangle, square, circle, triangle, crescent shape, or a "Chevron symbol" shape, and/or any other suitable shapes. The shutter can be used for any epitaxial thin film growth allowing crystals grow in lateral and vertical directions simultaneously on a substrate. For example, the shutter can be used for growing a lattice matching layer in a multilayered substrate structure which is disclosed in U.S. patent application entitled "A Lattice Matching Layer For Use In A Multilayer Substrate Structure."

Many modifications and other example embodiments set forth herein will come to mind to the reader knowledgeable in the technical field to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims.

What is claimed is:

1. A method of depositing a film on a substrate, comprising:
   directing source material from a material source onto a surface of the substrate using a line-of-sight deposition method;
   blocking, via a shutter, a portion of the substrate to form a blocked substrate portion and an unblocked substrate portion, wherein the shutter is disposed between the substrate and the source material and prevents deposition of the source material onto the blocked portion of the substrate;
   positioning the shutter relative to the substrate, into an a first position, wherein the unblocked substrate portion is only a corner of the substrate, and while in the first position;
      growing a seed grain with a desired crystallographic orientation in a region of the unblocked substrate portion, wherein the seed grain is employed to initiate crystallization and provide a point of origin for the depositing of the film; and
   displacing, from the first position, the shutter relative to the substrate during the deposition of the film such that the blocked substrate portion decreases and the unblocked substrate portion increases, thereby resulting in lateral epitaxial growth across the substrate.

2. The method of claim 1 further comprising growing crystals on the substrate with one or more grains serving as seed crystals.

3. The method of claim 1 further comprising patterning, by applying one of a lithography process, laser heating process and ablation, at least a portion of the substrate to form a surface relief structure, wherein the surface relief structure induces a desired crystalline orientation in the film, wherein the surface relief structure serves as a template for growing a seed grain on the substrate.

4. The method of claim 1 further comprising blocking a portion of the substrate by a trailing control shutter to control or avoid epitaxial deposition on the crystallized film formed on the portion of the substrate blocked by the trailing control shutter.

5. The method of claim 1 further comprising collimating the source material using a collimator disposed between the source material and the substrate.

6. The method of claim 1, wherein the line-of-sight deposition method comprises one of physical vapor deposition and chemical vapor deposition.

7. The method of claim 6, wherein the physical vapor deposition comprises one of vacuum evaporation, sputtering, molecular beam epitaxy, atomic layer deposition, atomic layer epitaxy, plasma torch deposition, and pulsed laser deposition.

8. The method of claim 7, wherein the evaporation method comprises one of thermal evaporation, laser beam or focused lamp evaporation, electron-beam evaporation, or arc-discharge evaporation.

9. The method of claim 7, wherein the sputtering comprises one of direct current magnetron sputtering, radio frequency magnetron sputtering, and laser sputtering.

10. The method of claim 6, wherein the chemical vapor deposition comprises atmospheric pressure chemical vapor deposition.

11. The method of claim 1 further comprising heating the substrate by one of infrared heating, hot wire radiative heating, lasers, focused lamp heating, inductive heating, direct metal pedestal heaters and ceramic pedestal heat sources.

* * * * *